(12) United States Patent
Scheiper et al.

(10) Patent No.: US 8,871,586 B2
(45) Date of Patent: Oct. 28, 2014

(54) METHODS OF REDUCING MATERIAL LOSS IN ISOLATION STRUCTURES BY INTRODUCING INERT ATOMS INTO OXIDE HARD MASK LAYER USED IN GROWING CHANNEL SEMICONDUCTOR MATERIAL

(71) Applicant: GLOBALFOUNDRIES Inc., Grand Cayman (KY)

(72) Inventors: Thilo Scheiper, Dresden (DE); Jan Hoentschel, Dresden (DE); Markus Lenski, Dresden (DE); Rolf Stephan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/654,849

(22) Filed: Oct. 18, 2012

(65) Prior Publication Data

US 2014/0113419 A1  Apr. 24, 2014

(51) Int. Cl.
*H01L 21/8234* (2006.01)

(52) U.S. Cl.
USPC ............................................... 438/218

(58) Field of Classification Search
CPC ............... H01L 21/8236; H01L 27/092
USPC ..................................... 438/199–203, 218
See application file for complete search history.

(56) References Cited

U.S. PATENT DOCUMENTS

| | | | |
|---|---|---|---|
| 5,272,361 A | 12/1993 | Yamazaki | |
| 6,365,444 B2 | 4/2002 | Chen et al. | |
| 6,803,613 B2 | 10/2004 | Ikeda et al. | |
| 7,125,759 B2 | 10/2006 | Chen et al. | |
| 7,485,929 B2 | 2/2009 | Chen et al. | |
| 7,790,543 B2 | 9/2010 | Abadeer et al. | |
| 2002/0009835 A1 | 1/2002 | Chen et al. | |
| 2002/0044111 A1 | 4/2002 | Yamazaki et al. | |
| 2004/0132240 A1* | 7/2004 | Kojima et al. | 438/199 |
| 2009/0159932 A1* | 6/2009 | Pinto et al. | 257/255 |
| 2011/0179852 A1 | 7/2011 | Polonsky et al. | |
| 2012/0098067 A1* | 4/2012 | Yin et al. | 257/351 |

\* cited by examiner

*Primary Examiner* — Brook Kebede
(74) *Attorney, Agent, or Firm* — Amerson Law Firm, PLLC

(57) ABSTRACT

In one example, the method includes forming a plurality of isolation structures in a semiconducting substrate that define first and second active regions where first and second transistor devices, respectively, will be formed, forming a hard mask layer on a surface of the substrate above the first and second active regions, wherein the hard mask layer comprises at least one of carbon, fluorine, xenon or germanium ions, performing a first etching process to remove a portion of the hard mask layer and expose a surface of one of the first and second active regions, after performing the first etching process, forming a channel semiconductor material on the surface of the active region that was exposed by the first etching process, and after forming the channel semiconductor material, performing a second etching process to remove remaining portions of the hard mask layer that were not removed during the first etching process.

35 Claims, 11 Drawing Sheets

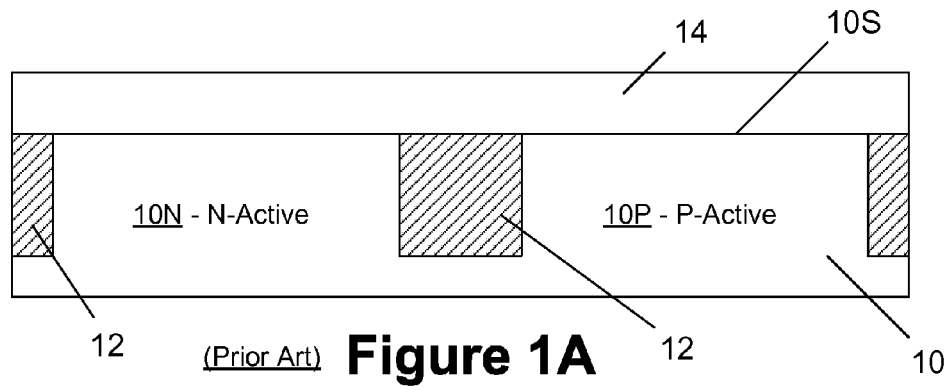
(Prior Art) Figure 1A
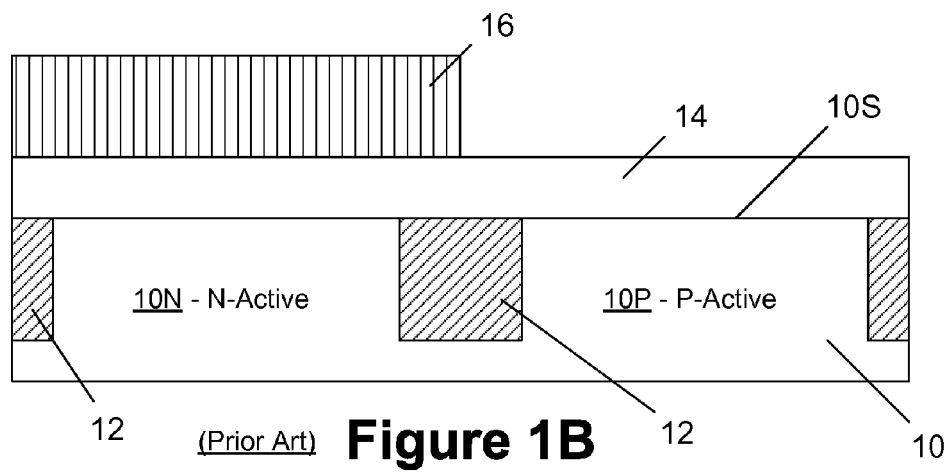
(Prior Art) Figure 1B
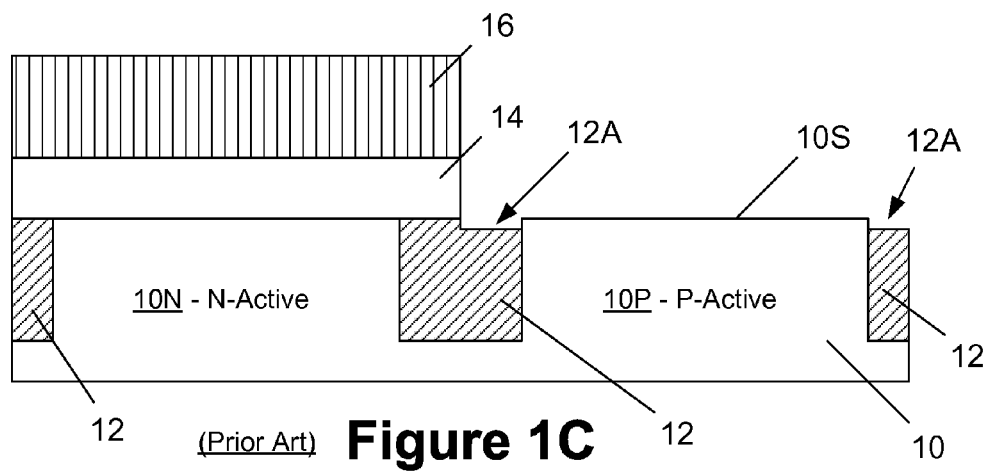
(Prior Art) Figure 1C

US 8,871,586 B2

METHODS OF REDUCING MATERIAL LOSS IN ISOLATION STRUCTURES BY INTRODUCING INERT ATOMS INTO OXIDE HARD MASK LAYER USED IN GROWING CHANNEL SEMICONDUCTOR MATERIAL

BACKGROUND OF THE INVENTION

1. Field of the Invention

Generally, the present disclosure relates to the manufacture of sophisticated semiconductor devices, and, more specifically, to various methods of reducing material loss in isolation structures, such as trench isolation structures, during the process flow performed to grow channel semiconductor materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layer are patterned. Then, an etching process is performed to form trenches in the substrate for the STI structure using the patterned pad oxide layer and pad nitride layer as an etch mask. Thereafter, a deposition process, such as the well-known High Aspect Ratio Process (HARP) offered by Applied Materials, is performed to overfill the trenches with an insulating material such as silicon dioxide. The deposited silicon dioxide material is then typically densified by subjecting it to an anneal process in a furnace, e.g., about 1000° C. for a duration of about 30 minutes. The purpose of the densification process is to increase the etch resistance of the silicon dioxide material to later wet etching processes. Thereafter, a chemical mechanical polishing (CMP) process is performed using the pad nitride layer as a polish stop layer to remove the excess insulation material positioned outside of the trenches. Then, a subsequent deglazing (etching) process may be performed to insure that the silicon dioxide insulating material is removed from the surface of the pad nitride layer. This deglaze process may remove some of the material of the STI structures. Thereafter, a wet nitride strip process, e.g., a hot phosphoric acid process, is performed to selectively remove the pad nitride layer relative to the pad oxide layer and the STI structure. If desired, the pad oxide layer may also be removed at this time by performing a quick wet etching process using a dilute HF chemistry. Alternatively, the pad oxide layer may be left in place or removed at a later point in the process flow.

Numerous processing operations are performed in a very detailed sequence, or process flow, to form integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. The attacks are not uniform across the surface of the STI structure due to, for example, masking only certain portions of the STI structure during some etching processes. As a result, there is an uneven loss of material in the STI structure, sometimes referred to as "divots."

One illustrative situation where divots may be created in STI structures involves the formation of NFET and PFET transistor devices on the same substrate, i.e., CMOS (complementary metal oxide semiconductor) technology, due to different materials and construction techniques used in forming the two different types of devices. Typically, manufacturing integrated circuit devices using CMOS technology involves many masking operations wherein one of the device regions is masked, e.g., the N-active region, while the other region, e.g., the P-active region, is subjected to various processing operations, e.g., etching, selective deposition of materials, etc. Since the various mask layers used in manufacturing CMOS-based products typically only cover about half of the STI structures, the STI structures are subjected to different processing operations. As a result, undesirable divots are formed in STI structures in CMOS-based products.

FIGS. 1A-1H depict one illustrative prior art process flow wherein undesirable material loss may occur in isolation regions that are formed in the substrate. As shown in FIG. 1A, various isolation structures 12 have been formed in a semiconducting substrate 10 which thereby define an N-active region 10N and a P-active region 10P wherein an NFET device and a PFET device, respectively, will be formed. The substrate 10 may have a variety of configurations, such as the depicted bulk silicon configuration.

As depicted in FIG. 1A, a hard mask layer comprised of silicon dioxide 14 has been deposited on the surface 10S of the substrate 10. The hard mask layer 14 may be formed using traditional techniques, e.g., by performing a chemical vapor deposition (CVD) process, and its thickness may vary, e.g., it may have a thickness in the range of about 6 nm.

As shown in FIG. 1B, a first patterned mask layer 16, e.g., a patterned photoresist mask, is formed above the hard mask layer 14. The first patterned mask layer 16 covers the N-active region 10N and exposes the portion of the hard mask layer 14 that is positioned above the P-active region 10P for further processing. The first patterned mask layer 16 may be formed using traditional photolithography tools and techniques.

As shown in FIG. 1C, an etching process, such as a wet etching process using a dilute HF chemistry, is performed through the first patterned mask layer 16 to remove the exposed portions of the hard mask layer 14. The etching process is typically performed for a sufficient duration to insure that the surface 10S of the P-active region 10P is clear of silicon dioxide material, i.e., typically there is a brief over-etching period to insure removal of the material of the hard mask layer 14. During this etching process, the exposed portions of the isolation structures 12, which are typically also comprised of silicon dioxide, are also subjected to the etching process. As a result, there is some consumption of the isolation structures 12 during this etching process, i.e., illustrative divots 12A are formed in the exposed portions of the isolation structures 12. The depth of these divots 12A at this point in the process may vary depending upon the application, but, in one example, the depth of the divots 12A at this point in the process flow may be about 15-30 nm.

With reference to FIG. 1D, the next process operations involve removing the first patterned mask layer 16 and then performing a cleaning process to insure that the surface of the P-active region 10P is free of any undesirable residual materials prior to forming a layer of epitaxially grown semiconductor material on the P-active region 10P. The first patterned mask layer 16 may be removed using a variety of techniques, e.g., a plasma-based ashing process. The cleaning process may be a wet, dilute HF acid cleaning process that is performed for a relatively short duration. The isolation structures 12 are also exposed to this epi pre-clean process, which increases the depth of the existing divots 12A. In one illustrative example, the epi pre-clean process may increase the depth of the divots 12A by about 5-20 nm. Thus, after the isolation structures 12A are exposed to the etching process that was performed to remove the hard mask layer 16 and the epi pre-clean process, the final depth of the divots 12A due to these two process operations may be about 20-50 nm.

FIG. 1E depicts the device after a layer of channel semiconductor material 18, e.g., silicon/germanium, has been selectively formed on the P-active region 10P by preforming an epitaxial deposition process. In some applications, a relatively shallow recess (not shown) may be formed in the P-active region 10P prior to forming the channel semiconductor material 18. Typically, such a layer of channel semiconductor material 18 is not formed on the N-active region 100N where the NFET device will be formed, but that may not be the case in all applications.

Next, as shown in FIG. 1F, a second patterned mask layer 20, e.g., a patterned photoresist mask 20, is formed above the channel semiconductor material 18. The second patterned mask layer 20 covers the P-active region 10P and exposes the portion of the hard mask layer 14 that is positioned above the N-active region 10N for further processing. The second patterned mask layer 20 may be formed using traditional photolithography tools and techniques.

Then, as shown in FIG. 1G, an etching process, such as a wet etching process using a dilute HF chemistry, is performed through the second patterned mask layer 20 to remove the exposed portions of the hard mask layer 14. The etching process is typically performed for a sufficient duration to insure that the surface 10S of the N-active region 10N is clear of silicon dioxide material, i.e., typically there is a brief over-etching period to insure removal of the material of the hard mask layer 14. During this etching process, the exposed portions of the isolation structures 12, which are typically also comprised of silicon dioxide, are also subjected to the etching process. As a result, there is some consumption of the isolation structures 12 during this etching process, i.e., illustrative divots 12B are formed in the exposed portions of the isolation structures 12. The depth of these divots 12B at this point in the process may vary depending upon the application, but, in one example, the depth of the divots 12B at this point in the process flow may be about 15-30 nm.

FIG. 1H depicts the device after the second patterned mask layer 20 has been removed, e.g., by performing a plasma-based ashing process. As depicted, the process flow described above results in undesirable and uneven consumption of the material of the isolation structures 12 which adds to the overall uneven topography of the upper surface of the substrate 10. The uneven topography resulting, at least in part, from the uneven consumption of the isolation structures 12 can be problematic for several reasons. For example, the uneven topography resulting from the uneven consumption of the isolation structures 12 can make it more difficult for CMP processes to obtain planar surfaces. Additionally, if the depth of the divots (e.g., 12A or 12B) is too great, there is an increased chance that there may be a loss of gate encapsulation as processing continues. The presence of such divots may also cause an increase in the degree of undesirable "footing" of the gate materials when they are patterned to define the gate structures for the transistor devices. In some cases, the depth of the divots may be so great that there is a risk of incomplete etching for one or more of the conductive materials in the gate structures such that there is a short-circuit created between adjacent gate structures. Such a situation is sometimes referred to as the creation of undesirable "poly stringers" between adjacent gate structures. As a result, the isolation structures 12 that are subjected to excessive and/or uneven material loss during various process operations may not perform their isolation function as intended, which may result in problems such as increased leakage currents, device failure, etc.

The present disclosure is directed to various methods of forming isolation structures that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of reducing material loss in isolation structures, such as trench isolation structures, during the process flow performed to grow channel semiconductor materials. In one example, the method includes forming a plurality of isolation structures in a semiconducting substrate that define first and second active regions where first and second transistor devices, respectively, will be formed, forming a hard mask layer on a surface of the substrate above the first and second active regions, wherein the hard mask layer comprises at least one of carbon, fluorine, xenon or germanium ions, performing a first etching process to remove a portion of the hard mask layer and thereby expose a surface of one of the first and second active regions, after performing the first etching process, forming a channel semiconductor material on the surface of the active region that was exposed by performing the first etching process, and after forming the channel semiconductor material, performing a second etching process to remove remaining portions of the hard mask that were not removed during the first etching process.

In one example, the method includes forming a plurality of isolation structures comprised of silicon dioxide in a semiconducting substrate that define first and second active regions where first and second transistor devices, respectively, will be formed, forming a hard mask layer comprised of silicon dioxide on a surface of the substrate above the first and second active regions, wherein the hard mask layer comprises a region that contains at least one of carbon, fluorine, xenon or germanium ions, performing a first etching process to remove a portion of the hard mask layer and thereby expose a surface of one of the first and second active regions, after performing the first etching process, forming a channel semiconductor material on the surface of the active region that was exposed by performing the first etching process, and after forming the channel semiconductor material, performing a second etching process to remove remaining portions of the hard mask that were not removed during the first etching process.

In another more detailed embodiment, the carbon, fluorine, xenon or germanium ions are introduced into the hard mask layer by depositing a layer of hard mask material on the surface of the substrate, performing a first ion implantation process to introduce the ions into a first portion of the layer of hard mask material, and performing a second ion implantation process to introduce the ions into a second portion of the layer of hard mask material.

In yet another more detailed embodiment, the carbon, fluorine, xenon or germanium ions are introduced into the hard mask layer by depositing a layer of hard mask material on the surface of the substrate and performing a single ion implantation process to introduce the ions into the layer of hard mask material.

Yet another detailed embodiment whereby the carbon, fluorine, xenon or germanium ions are introduced into the hard mask layer involves performing an in situ deposition process to form the hard mask layer, wherein the carbon, fluorine, xenon or germanium ions are introduced into the hard mask layer during the in situ deposition process.

BRIEF DESCRIPTION OF THE DRAWINGS

The disclosure may be understood by reference to the following description taken in conjunction with the accompanying drawings, in which like reference numerals identify like elements, and in which:

FIGS. 1A-1H depict one illustrative process flow depicting the illustrative situation where there is undesirable consumption of the isolation structures during the process of growing a channel semiconductor material on a P-active region of a semiconducting substrate;

Figure 1D:
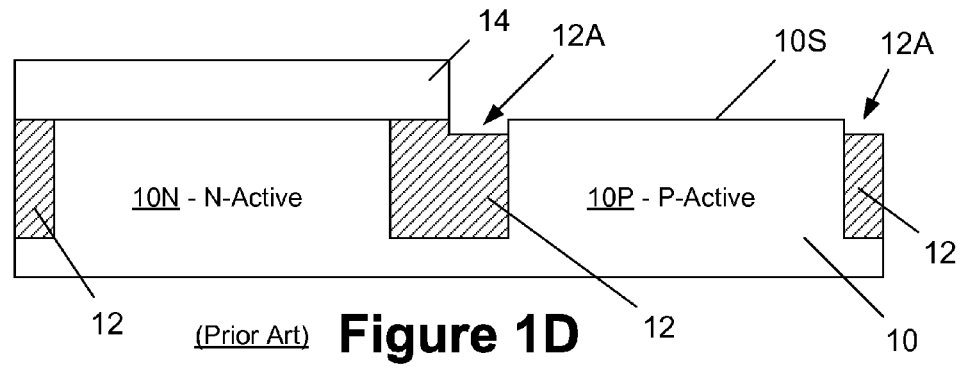
Figure 1E:
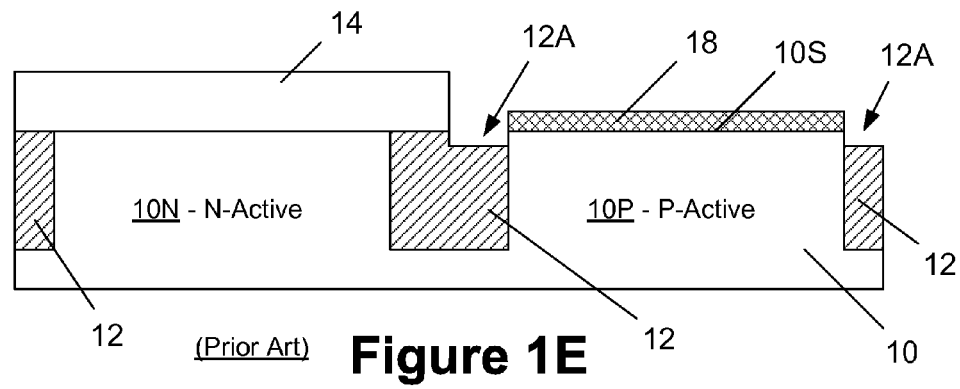
Figure 1F:
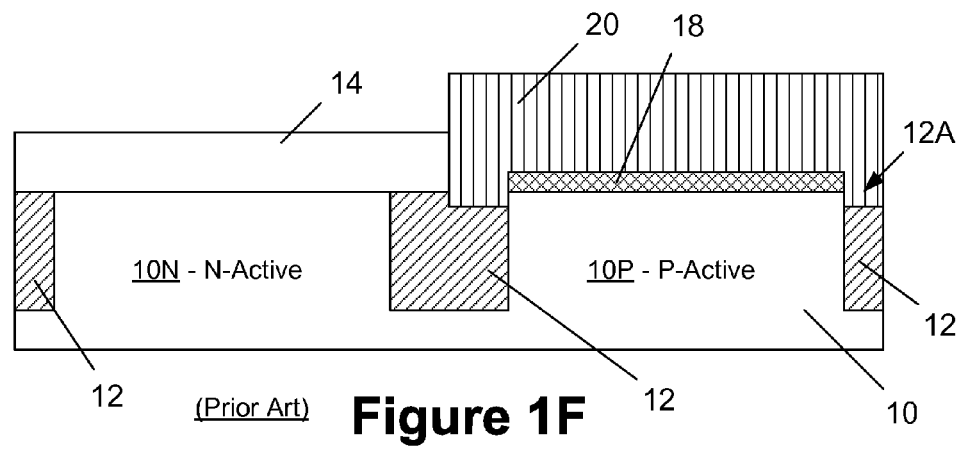
Figure 1G:
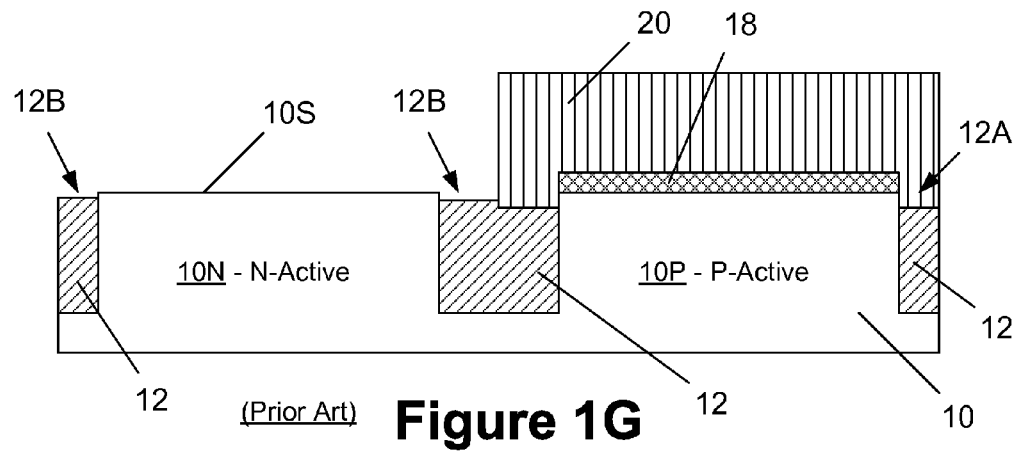
Figure 1H:
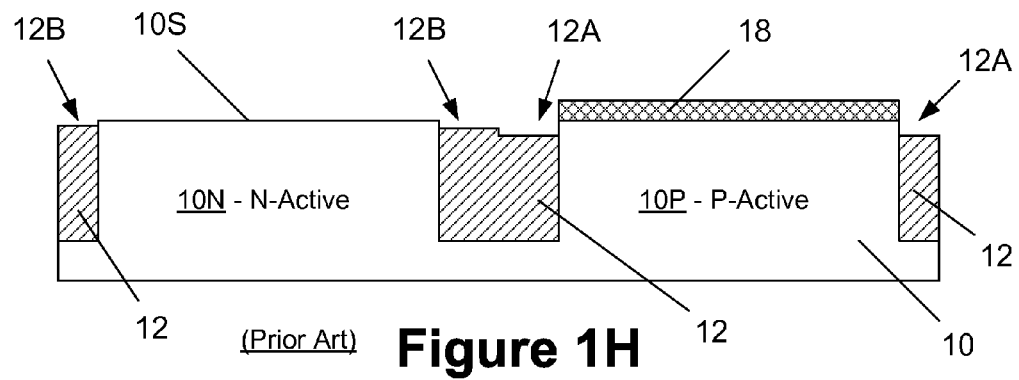

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of reducing material loss in isolation structures, such as trench isolation structures, during the process flow performed to grow channel semiconductor materials. As will be readily apparent to those skilled in the art upon a complete reading of the present application, the present method is applicable to a variety of devices, including, but not limited to, logic devices, memory devices, etc. With reference to the attached drawings, various illustrative embodiments of the methods and devices disclosed herein will now be described in more detail.

Figure 2A:
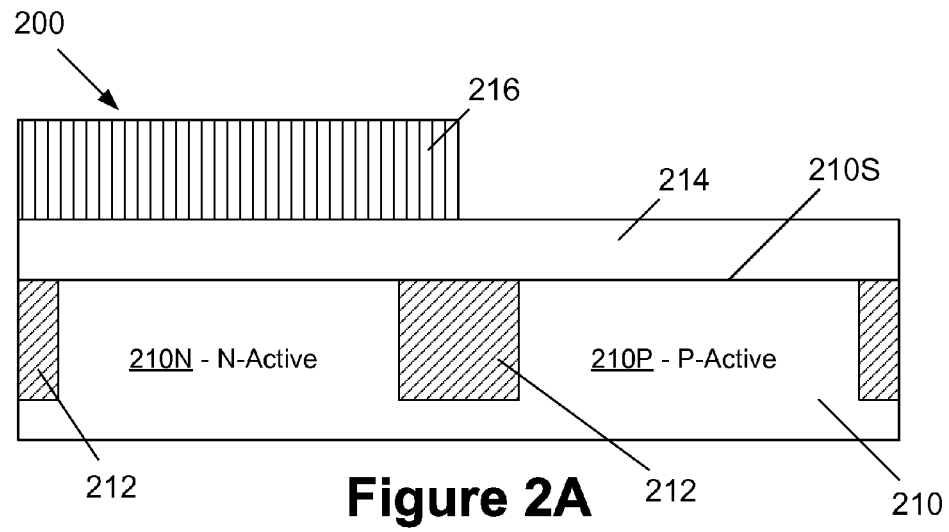
FIGS. 2A-2H depict one illustrative method disclosed herein of reducing material loss in isolation structures by performing multiple ion implantation steps to implant inert ions into a hard mask layer that is used during the process of growing a channel semiconductor material.

FIGS. 2A-2H depict one illustrative process flow disclosed herein for reducing material loss in isolation structures of an integrated circuit device 200 by performing multiple ion implantation steps to implant inert ions into a hard mask layer that is used during the process of growing a channel semiconductor material. As shown in FIG. 2A, various isolation structures 212 have been formed in a semiconducting substrate 210 which thereby define an N-active region 210N and a P-active region 210P wherein an NFET device and a PFET device, respectively, will be formed. The substrate 210 has an upper surface 210S. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 210 may also be made of materials other than silicon.

As depicted in FIG. 2A, a hard mask layer 214 has been deposited on the surface 210S of the substrate 210. The hard mask layer 214 may be comprised of a variety of different materials, for example, silicon nitride, silicon dioxide, etc., it may formed using traditional techniques, e.g., by performing a chemical vapor deposition (CVD) process, and its thickness may vary, e.g., it may have a thickness in the range of about 8-15 nm. Also depicted in FIG. 2A is a first patterned mask layer 216, e.g., a patterned photoresist mask, that has been formed above the hard mask layer 214. The first patterned mask layer 216 covers the N-active region 210N and exposes the portion of the hard mask layer 214 that is positioned above the P-active region 210P for further processing. The first patterned mask layer 216 may be formed using traditional photolithography tools and techniques.

Figure 2B:
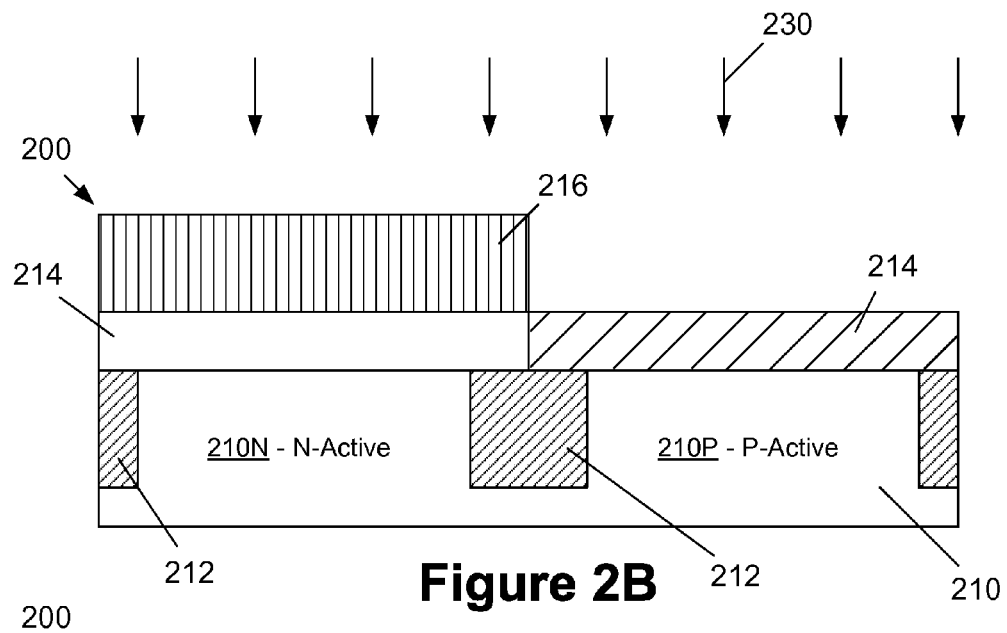

Next, as shown in FIG. 2B, a first ion implantation process 230 is performed to implant relatively inert ions, such as carbon, fluorine, xenon, germanium, etc., into the exposed portions of the hard mask layer 214. In general, the larger the inert ion the better so as to "destroy" the lattice structure of the hard mask layer 214 to thereby cause a more significant change in etch rate. In one illustrative embodiment, the ion implantation process 230 may be performed using a dopant dose that falls within the range of about $1\ e^{14}\text{-}3\ e^{15}$ ions/cm$^2$ and with an implant energy of about 10-50 keV. The presence of the inert ions in the hard mask layer 214 is depicted by the cross-hatching of the portion of the hard mask layer 214 positioned above the P-active region 210P (compare FIGS. 2A and 2B).

The inert ions introduced into the hard mask layer 214 change the etching characteristics of the hard mask layer 214 (with the ions) relative to the etching characteristics of the material of the isolation regions 212, e.g., a silicon dioxide material such as an HDP oxide, a HARP oxide, etc. More specifically, the introduction of the ions into the hard mask layer 214 increases the etch rate of the hard mask material 214 when exposed to an etchant designed to remove silicon dioxide material, such as a wet, HF based etching process. That is, when subjected to a common etching process, a silicon dioxide hard mask layer 214 with the implanted inert ions will etch at a faster rate than that of the silicon dioxide isolation structure 212. Accordingly, the subsequent etching process that will be performed to remove the exposed portions of the hard mask layer 214 may be performed for a shorter duration, thereby limiting the consumption of the material of the exposed portions of the isolation regions 212.

Figure 2C:
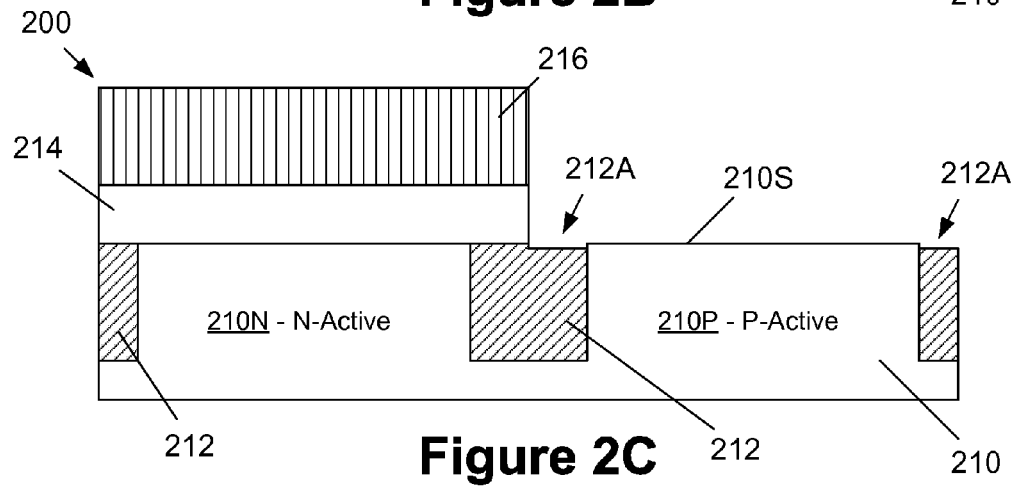

As shown in FIG. 2C, and as discussed above, a first etching process, such as a wet etching process using a dilute HF chemistry, is performed through the first patterned mask layer 216 to remove the exposed portions of the hard mask layer 214. The etching process is typically performed for a sufficient duration to insure that the surface 210S of the P-active region 210P is clear of the material of the hard mask layer 214, i.e., typically there is a brief over-etching period to insure removal of the material of the hard mask layer 214. There is some consumption of the isolation structures 212 which are typically also comprised of silicon dioxide during the first etching process. That is, illustrative divots 212A are formed in the exposed portions of the isolation structures 212. The depth of these divots 212A after the first etching process is performed may vary depending upon the application, but, in one example, the depth of the divots 212A at this point in the process flow may be about 3-10 nm. However, it should be noted that, due to the introduction of the inert ions into the hard mask layer 214 prior to etching the hard mask material 214, the depth of the divots 212A may be less than the depth of the divots 12A formed when performing the illustrative process flow described in the background section of this application.

Figure 2D:
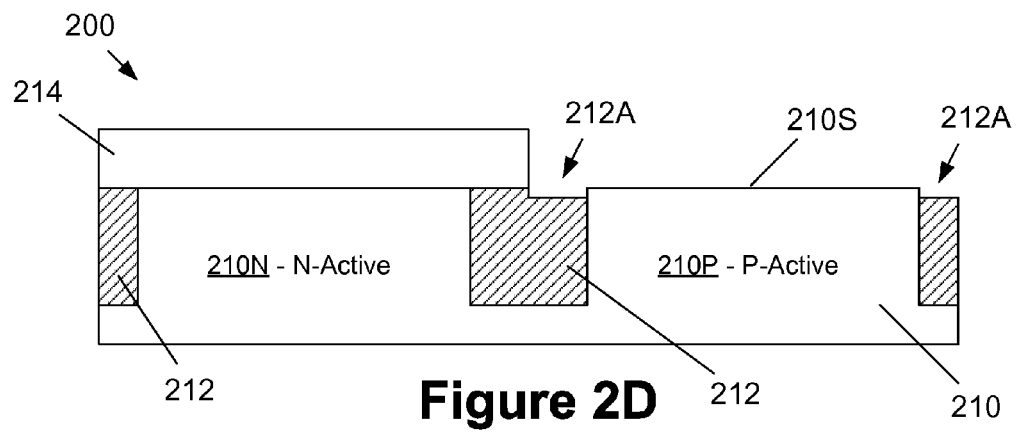

With reference to FIG. 2D, the next process operations involve removing the first patterned mask layer 216 and then performing a epi pre-clean process to insure that the surface 210S of the P-active region 210P is free of any undesirable residual materials prior to forming a layer of epitaxially grown semiconductor material on the P-active region 210P. The first patterned mask layer 216 may be removed using a variety of techniques, e.g., by performing a plasma-based ashing process. The epi pre-clean process may be a wet, dilute HF acid cleaning process that is performed for a relatively short duration. The isolation structures 212 are also exposed to this epi pre-clean process which increases the depth of the existing divots 212A. In one illustrative example, the epi pre-clean process may increase the depth of the divots 212A by about an additional 0.5-1.5 nm. Thus, after the isolation structures 212A have been exposed to the first etching process that was performed to remove the hard mask layer 214 and the epi pre-clean process, the total final depth of the divots 212A due to these two process operations may be about 3.5-11.5 nm.

Figure 2E:
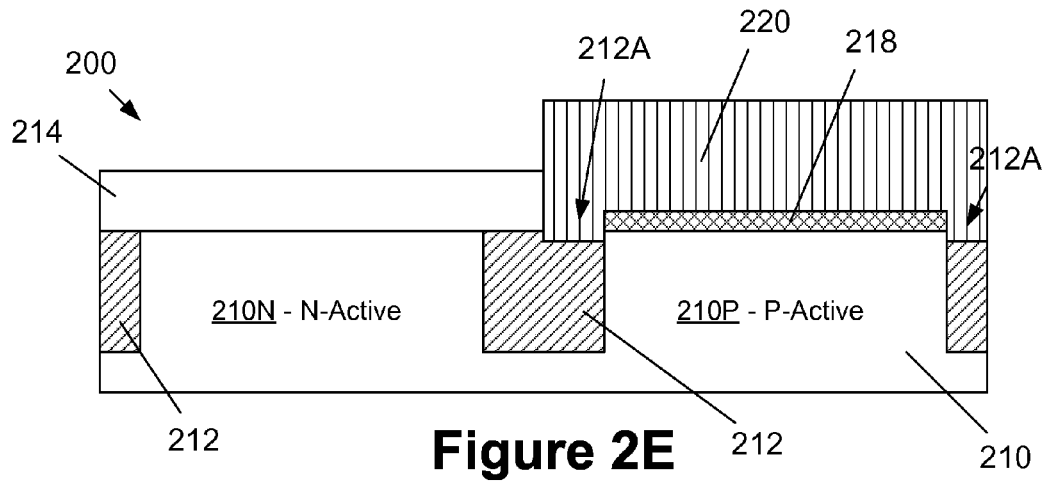

FIG. 2E depicts the device 200 after a layer of channel semiconductor material 218 has been formed on the P-active region 210P and after a second patterned mask layer 220 has been formed above the substrate 210. The layer of channel semiconductor material 218 may be comprised of a variety of different materials, e.g., silicon/germanium, silicon/carbon, Group III/V materials such as GaAs, InGaAs, etc., it may be selectively formed on the P-active region 210P by performing an epitaxial deposition process and it may have a thickness that varies depending upon the particular application, e.g., about 0.5-20 nm. In some applications, if desired, a relatively shallow recess (not shown) may be formed in the P-active region 210P prior to forming the channel semiconductor material 218. Typically, such a layer of channel semiconductor material 218 is not formed for the N-active region 210N where the NFET device will be formed, but that may not be the case in all applications. Thus, the inventions disclosed herein should not be considered as limited to the formation of any particular type of semiconductor material for the channel semiconductor material 218, nor to the locations of the channel semiconductor material 218, i.e., it may be formed only on the PFET device, only on the NFET device, different channel semiconductor materials may be formed for both of the NFET and PFET devices, etc. After the channel semiconductor material 218 is formed, the second patterned mask layer 220, e.g., a patterned photoresist mask, is formed above the substrate 210. The second patterned mask layer 220 covers the P-active region 210P and exposes the portion of the hard mask layer 214 that is positioned above the N-active region 210N for further processing. The second patterned mask layer 220 may be formed using traditional photolithography tools and techniques.

Figure 2F:
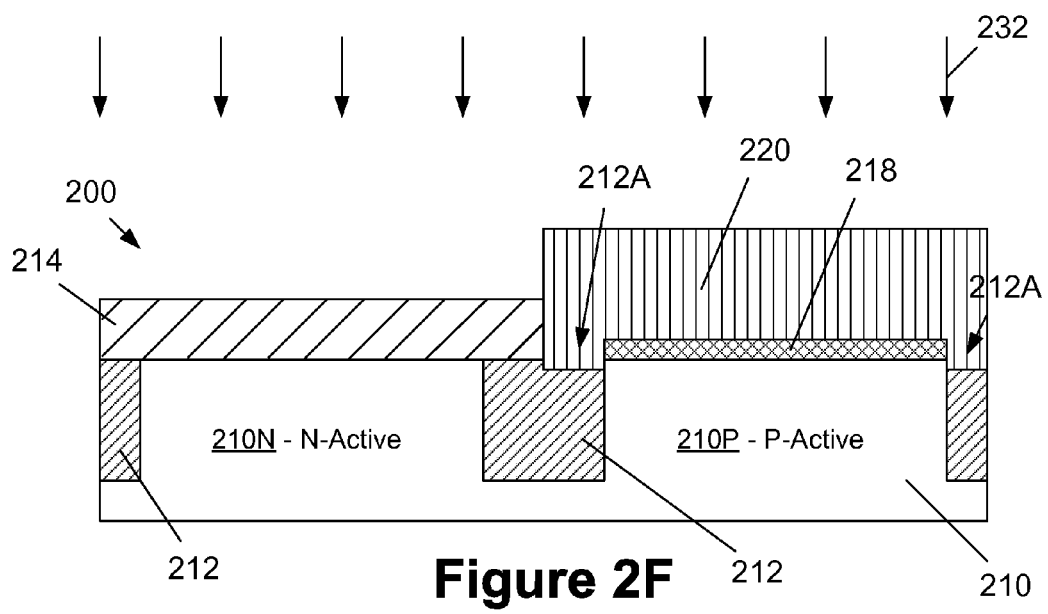

Next, as shown in FIG. 2F, a second ion implantation process 232 is performed through the mask layer 220 to implant inert ions, such as carbon, fluorine, xenon, germanium, etc., into the exposed portions of the hard mask layer 214 above the N-active region 210N. The second ion implantation process 232 may be performed using the same parameters as that described above for the first implantation process 230. The presence of the inert ions in the hard mask layer 214 is depicted by the cross-hatching of the portion of the hard mask layer 214 positioned above the N-active region 210N (compare FIGS. 2E and 2F).

Figure 2G:
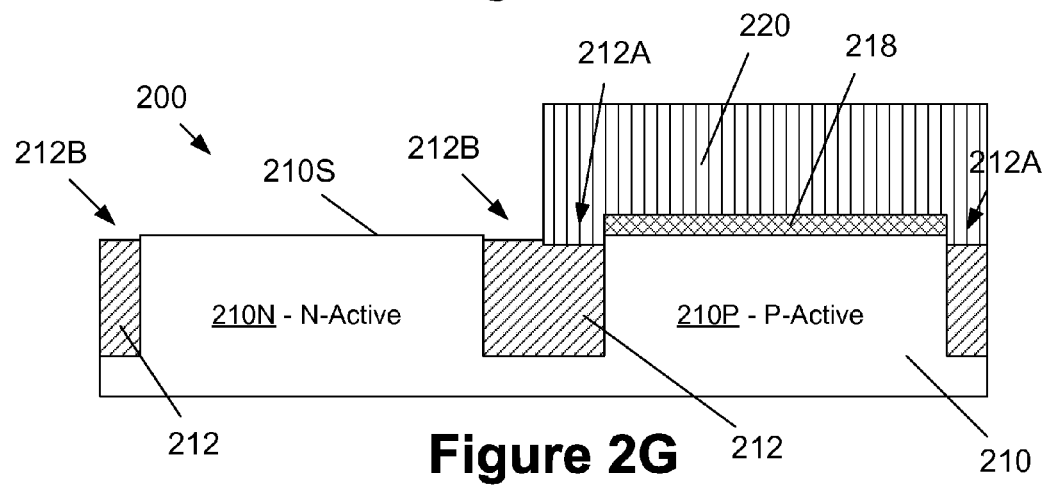

Then, as shown in FIG. 2G, a second etching process, such as a wet etching process using a dilute HF chemistry, is performed through the second patterned mask layer 220 to remove the exposed portions of the hard mask layer 214, i.e., to remove portions of the hard mask layer 214 that were not removed during the first etching process. The second etching process is typically performed for a sufficient duration to insure that the surface 210S of the N-active region 210N is clear of material of the hard mask layer 214, e.g., silicon dioxide. As noted previously, there is typically a brief over-etching period to insure removal of the material of the hard mask layer 214 from the surface 210S of the substrate 210. During this second etching process, the exposed portions of the isolation structures 212, which are typically also comprised of silicon dioxide, are also subjected to the second etching process. As a result, there is some consumption of the isolation structures 212 during this second etching process, i.e., illustrative divots 212B are formed in the exposed portions of the isolation structures 212. The depth of the divots 212B after the second etching process has been performed may vary depending upon the application, but, in one example, the depth of the divots 212B at this point in the process flow may be about 3-10 nm.

Figure 2H:
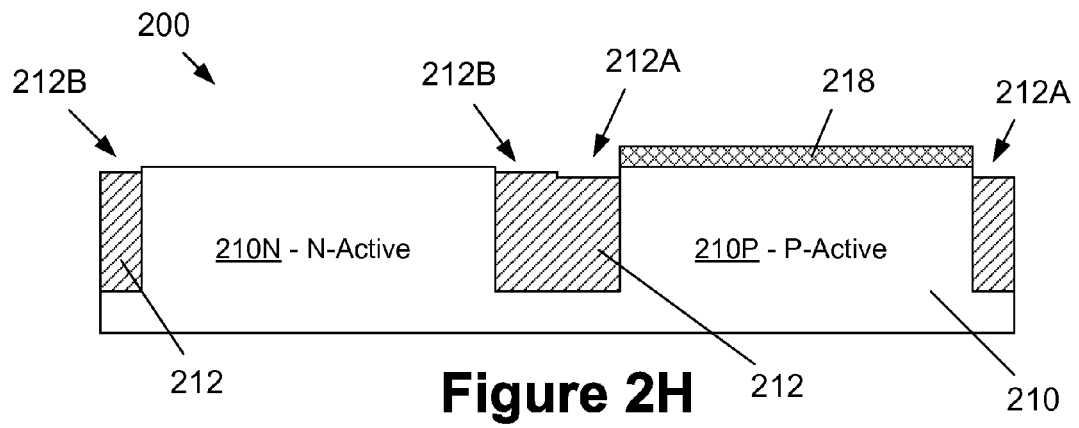

FIG. 2H depicts the device after the second patterned mask layer 220 has been removed, e.g., by performing a plasma-based ashing process. As can be seen, using the novel techniques disclosed herein, the overall depth of the divots 212A, 212B are less than the depth of the corresponding divots 12A, 12B described in the background section of this application. For example, in one embodiment, the overall depth of the divots 212A (after the first etching process to remove the hard mask layer 214 and the epi pre-clean processes have been performed) may be about 3-11.5 nm, while the depth of the divots 12A at a corresponding point in the illustrative prior art process flow described in FIGS. 1A-1H may be about 20-50 nm. Similarly, the overall depth of the divots 212B (after the etch process to remove the hard mask layer 214 is performed) may be about 3-10 nm, while the depth of the divots 12B at a corresponding point in the illustrative prior art process flow described in FIGS. 1A-1H may be about 15-30 nm. As a result, using the techniques disclosed herein, the consumption of the material of the isolation structures 212 may be generally reduced and there may also be a reduction in the topography changes of the isolation structures 212 as compared to the prior art process described in the background section of this application. Thus, by forming the device 200 using the methods disclosed herein, one or more of the problems outlined in the background section of this application may be reduced or eliminated.

Figure 3A:
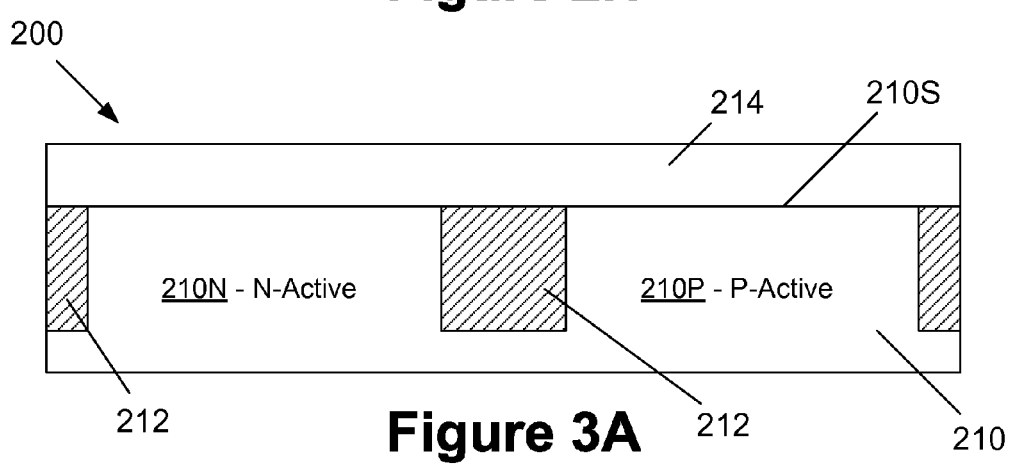
FIGS. 3A-3H depict another illustrative method disclosed herein of reducing material loss in isolation structures by performing a blanket ion implantation step to implant inert ions into a hard mask layer that is used during the process of growing a channel semiconductor material.

FIGS. 3A-3H depict another illustrative method disclosed herein of reducing material loss in isolation structures by performing a blanket ion implantation step to implant inert ions into a hard mask layer that is used during the process of growing a channel semiconductor material. As shown in FIG. 3A, the isolation structures 212 have been formed in the semiconducting substrate 210 to thereby define the N-active region 210N and the P-active region 210P wherein an NFET device and a PFET device, respectively, will be formed. As also depicted in FIG. 3A, the hard mask layer 214 has been deposited on the surface 210S of the substrate 210, e.g., by performing a CVD process. To the extent that the hard mask is made of silicon dioxide, it may be desirable to make it about 2-10 nm thicker than the final desired thickness as the pre-clean process that is typically performed to clear native oxides before the traditional channel silicon/germanium layer is formed for a PFET device would also attack the hard mask layer.

Figure 3B:
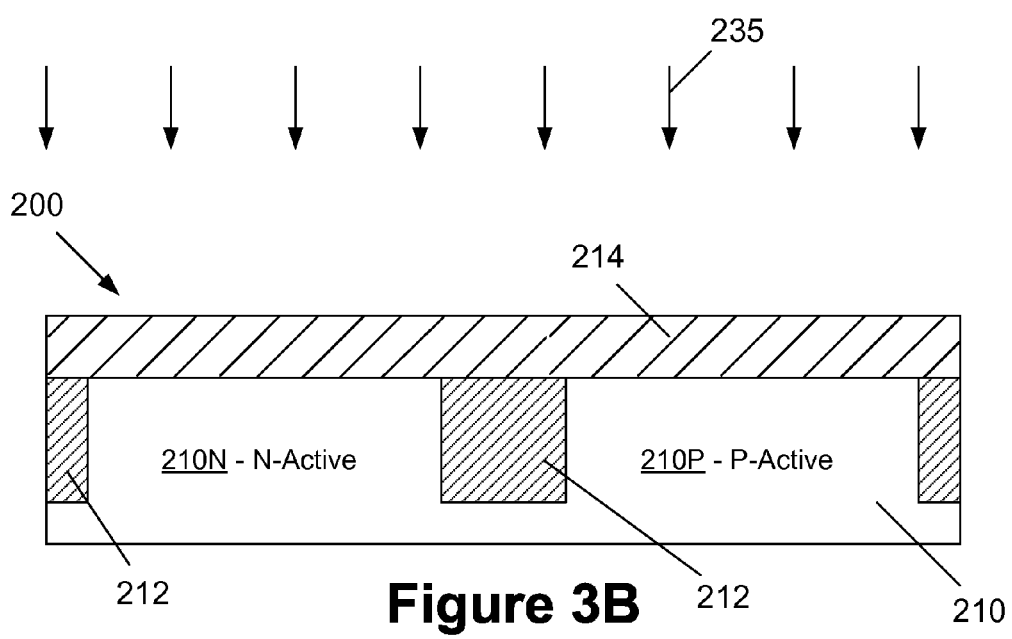

Next, as shown in FIG. 3B, a blanket ion implantation process 235 is performed to implant inert ions, such as carbon, fluorine, xenon, germanium, etc., into the hard mask layer 214. The blanket ion implantation process 235 may be performed using the same parameters as that described above for the first ion implantation process 230 and may result in the same concentration of implanted ions in the hard mask layer 214. The presence of the inert ions in the hard mask layer 214 is depicted by the cross-hatching of the hard mask layer 214 (compare FIGS. 3A and 3B).

Figure 3C:
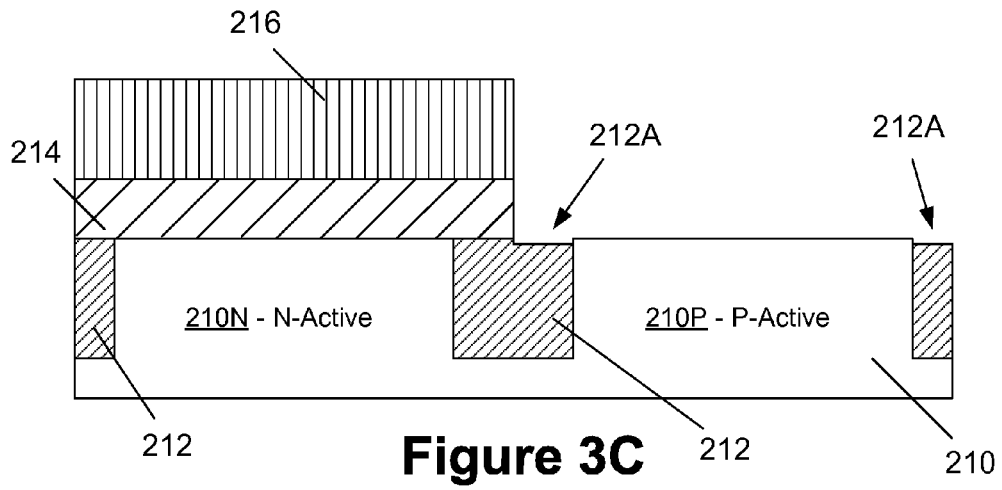

Next, as shown in FIG. 3C, the first patterned mask layer 216 has been formed above the hard mask layer 214. As before, the first patterned mask layer 216 covers the N-active region 210N and exposes the portion of the hard mask layer 214 that is positioned above the P-active region 210P for further processing. With continuing reference to FIG. 3C, the first etching process, such as a wet etching process using a dilute HF chemistry, is performed through the first patterned mask layer 216 to remove the exposed portions of the hard mask layer 214. As noted above, there is some consumption of the exposed portions of the isolation structures 212 which are typically also comprised of silicon dioxide during this first etching process. That is, illustrative divots 212A are formed in the exposed portions of the isolation structures 212. The discussion above regarding the illustrative depth of these divots 212A applies equally to this embodiment as well.

Figure 3D:
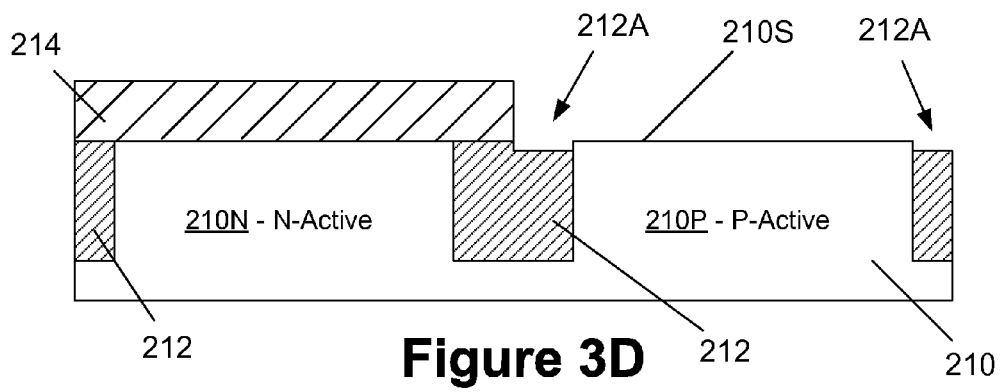

With reference to FIG. 3D, the next process operations involve removing the first patterned mask layer 216 and then performing the previously discussed epi pre-cleaning process to insure that the surface 210S of the P-active region 210P is free of any undesirable residual materials prior to forming a layer of epitaxially grown semiconductor material 218 (FIG. 3E) on the P-active region 210P. The first patterned mask layer 216 may be removed using a variety of techniques, e.g., by performing a plasma-based ashing process. The epi pre-clean process may be a wet, dilute HF acid cleaning process that is performed for a relatively short duration. As noted previously, the isolation structures 212 are also exposed to this epi pre-clean process which increases the depth of the existing divots 212A. The discussion above regarding the depth of the divots 212A after the epi pre-clean process applies equally to this embodiment as well.

Figure 3E:
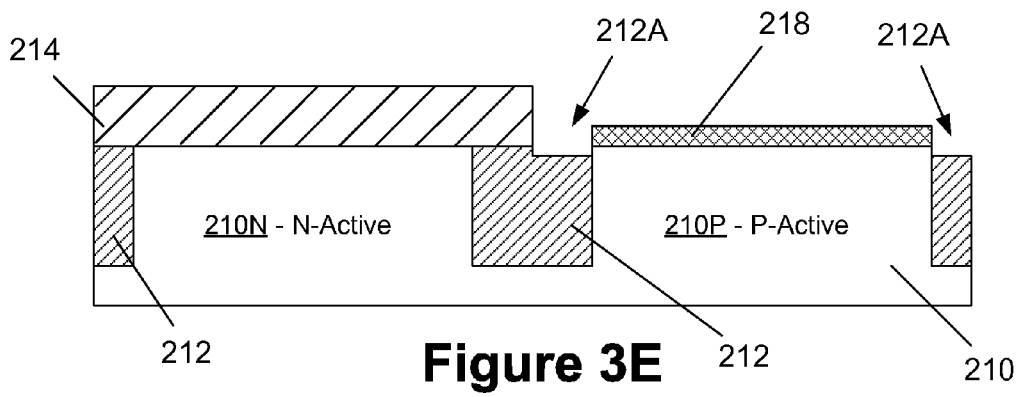
Figure 3F:
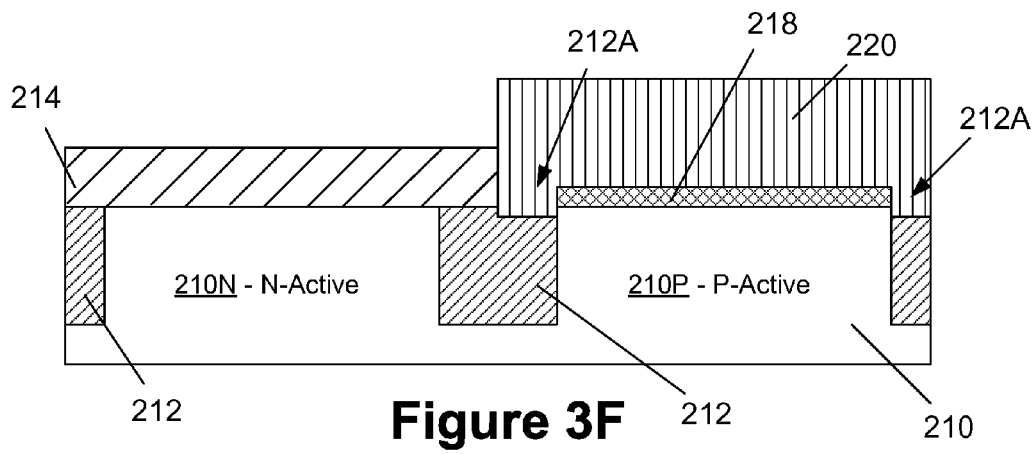

FIG. 3E depicts the device 200 after the layer of channel semiconductor material 218 has been formed on the P-active region 210P. Thereafter, as shown in FIG. 3F, the second patterned mask layer 220 is formed above the substrate 210. The second patterned mask layer 220 covers the P-active region 210P and exposes the portion of the hard mask layer 214 that is positioned above the N-active region 210N for further processing.

Figure 3G:
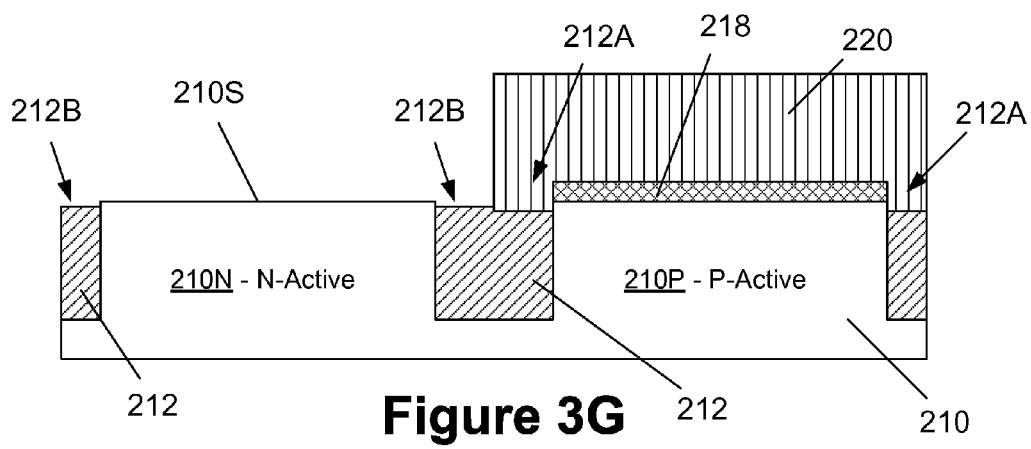

Then, as shown in FIG. 3G, the second etching process, such as a wet etching process using a dilute HF chemistry, is performed through the second patterned mask layer 220 to remove the exposed portions of the hard mask layer 214. As noted above, the second etching process is typically performed for a sufficient duration to insure that the surface 210S of the N-active region 210N is clear of material of the hard mask layer 214, e.g., silicon dioxide. During this second etching process, there is some consumption of the exposed portions of the isolation structures 212 during this etching process, i.e., illustrative divots 212B are formed in the exposed portions of the isolation structures 212. The discussion above regarding the depth of the divots 212B applies equally to this embodiment as well.

Figure 3H:
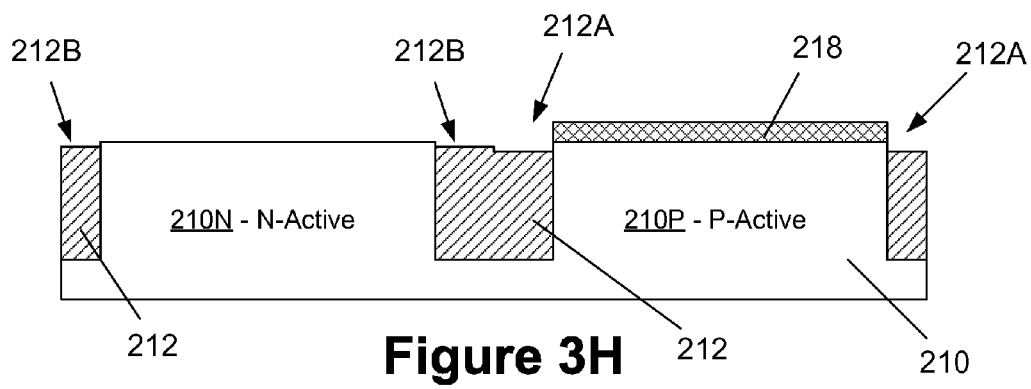

FIG. 3H depicts the device after the second patterned mask layer 220 has been removed, e.g., by performing a plasma-based ashing process. As can be seen, using this illustrative embodiment of the novel techniques disclosed herein, the consumption of the material of the isolation structures 212 may be generally reduced and there may be a reduction in the topography changes of the isolation structures 212 as compared to the prior art process described in the background section of this application. Thus, by forming the device 200 using this illustrative embodiment of the various methods disclosed herein, one or more of the problems outlined in the background section of this application may be reduced or eliminated.

Figure 4A:
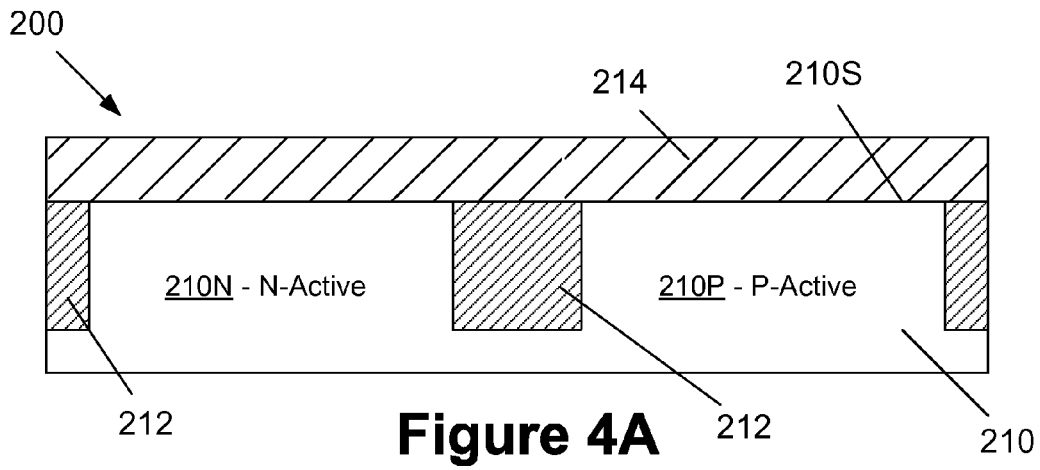
FIGS. 4A-4G depict another illustrative method disclosed herein of reducing material loss in isolation structures by introducing inert ions into a hard mask layer by performing a deposition process that involves in situ doping of the hard mask layer that is used during the process of growing a channel semiconductor material.

FIGS. 4A-4G depict another illustrative method disclosed herein of reducing material loss in isolation structures by introducing inert ions into a hard mask layer by performing a deposition process that involves in situ doping of the hard mask layer. As shown in FIG. 4A, the isolation structures 212 have been formed in the semiconducting substrate 210 to thereby define the N-active region 210N and the P-active region 210P wherein an NFET device and a PFET device, respectively, will be formed. To the extent that the hard mask layer 214 is made of silicon dioxide, its thickness may need to be increased as noted above.

As also depicted in FIG. 4A, the hard mask layer 214 has been deposited on the surface 210S of the substrate 210, e.g., by performing a CVD process. However, in this illustrative embodiment, inert ions, such as those that are used in the ion implantation process 230 described above, may be introduced in situ, i.e., while the hard mask layer 214 is being deposited. Techniques by which such ions are introduced in situ are well known to those skilled in the art. The presence of the inert ions in the hard mask layer 214 as a result of the in situ introduction of the inert ions is depicted by the cross-hatching of the hard mask layer 214.

Figure 4B:
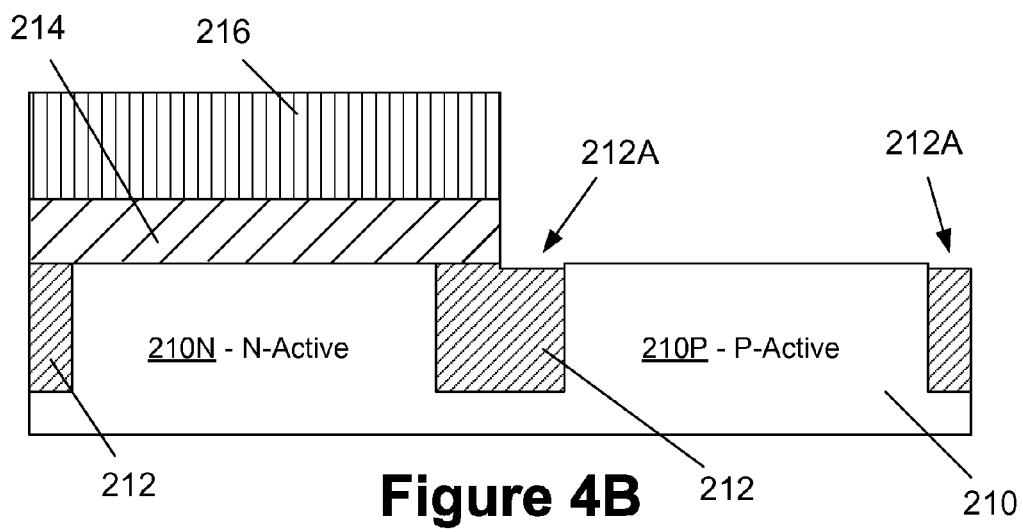

Next, as shown in FIG. 4B, the first patterned mask layer 216 has been formed above the hard mask layer 214. As before, the first patterned mask layer 216 covers the N-active region 210N and exposes the portion of the hard mask layer 214 that is positioned above the P-active region 210P for further processing. With continuing reference to FIG. 4B, the first etching process, such as a wet etching process using a dilute HF chemistry, is performed through the patterned mask layer 216 to remove the exposed portions of the hard mask layer 214. As noted above, there is some consumption of the exposed portions of the isolation structures 212, which are typically also comprised of silicon dioxide, during this first etching process. That is, illustrative divots 212A are formed in the exposed portions of the isolation structures 212 during the first etching process. The discussion above regarding the illustrative depth of these divots 212A after the first etching process is performed applies equally to this embodiment as well.

Figure 4C:
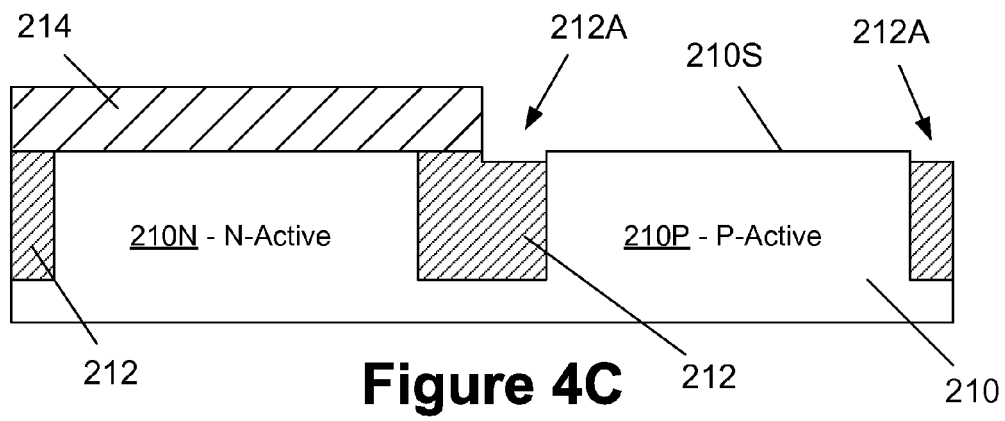

With reference to FIG. 4C, the next process operations involve removing the first patterned mask layer 216 and then performing the previously discussed epi pre-clean process to insure that the surface 210S of the P-active region 210P is free of any undesirable residual materials prior to forming the layer of epitaxially grown semiconductor material 218 (FIG. 4D) on the P-active region 210P. As discussed above, the first patterned mask layer 216 may be removed using a variety of techniques, e.g., by performing a plasma-based ashing process. The epi pre-clean process may be a wet, dilute HF acid cleaning process that is performed for a relatively short duration. As noted previously, the exposed portions of the isolation structures 212 are also exposed to this epi pre-clean process which increases the depth of the existing divots 212A.

The discussion above regarding the depth of the divots 212A after the epi pre-clean process applies equally to this embodiment as well.

Figure 4D:
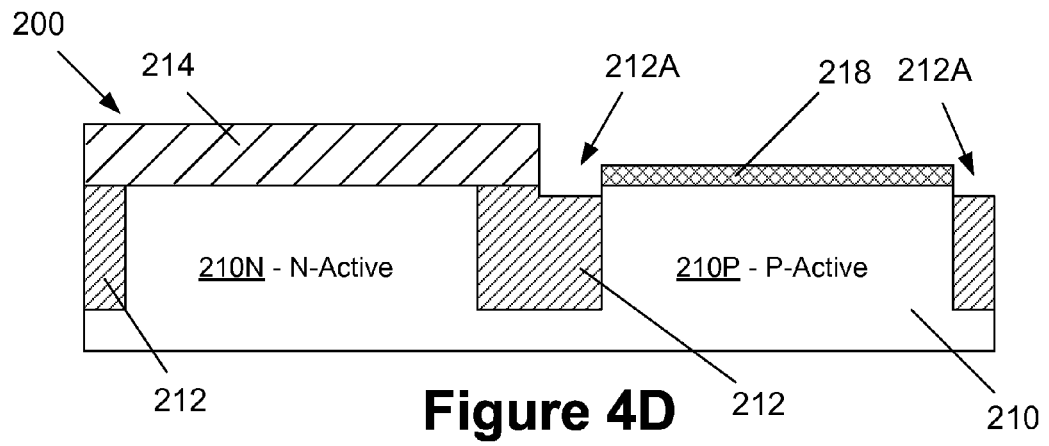
Figure 4E:
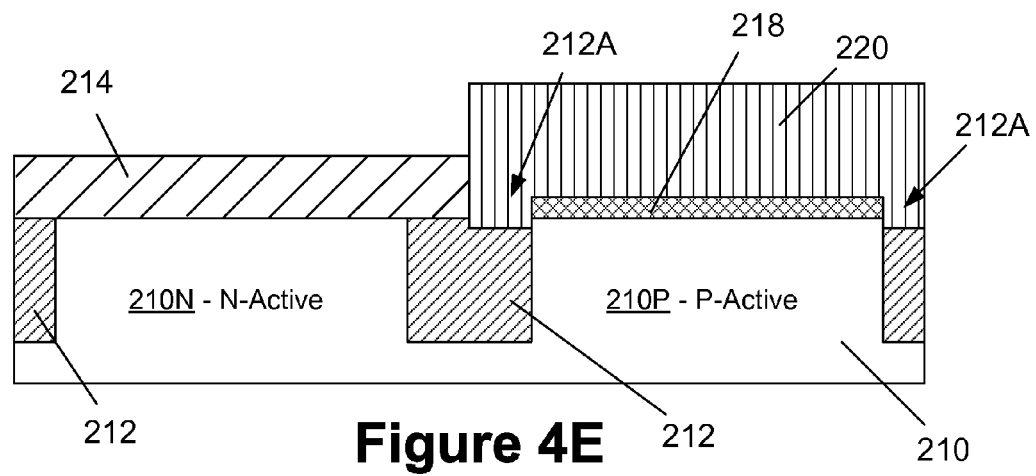

FIG. 4D depicts the device 200 after the layer of channel semiconductor material 218 has been formed on the P-active region 210P. Thereafter, as shown in FIG. 4E, the second patterned mask layer 220 is formed above the substrate 210. The second patterned mask layer 220 covers the P-active region 210P and exposes the portion of the hard mask layer 214 that is positioned above the N-active region 210N for further processing.

Figure 4F:
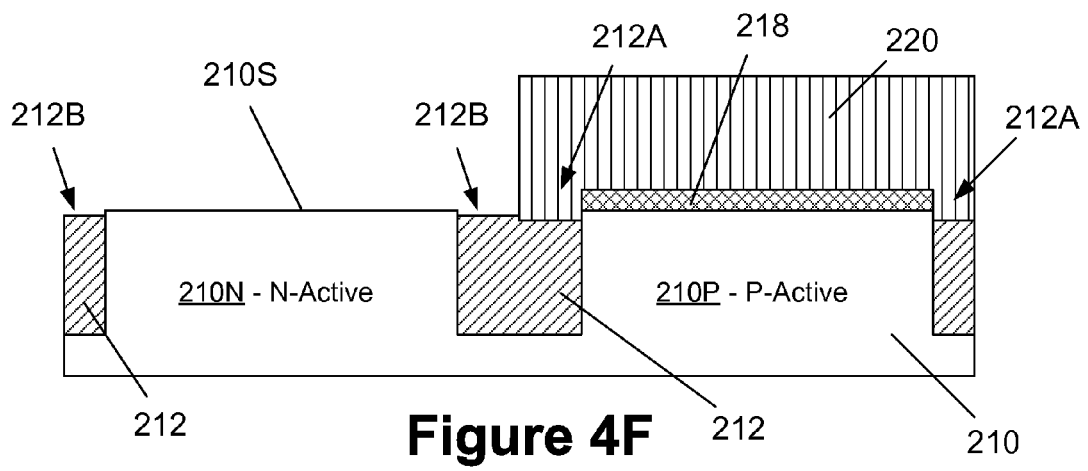

Then, as shown in FIG. 4F, the second etching process, such as a wet etching process using a dilute HF chemistry, is performed through the second patterned mask layer 220 to remove the exposed portions of the hard mask layer 214. As noted above, the second etching process is typically performed for a sufficient duration to insure that the surface 210S of the N-active region 210N is clear of material of the hard mask layer 214, e.g., silicon dioxide. During this second etching process, there is some consumption of the exposed portion of the isolation structures 212, i.e., illustrative divots 212B are formed in the exposed portions of the isolation structures 212. The discussion above regarding the depth of the divots 212B as a result of this second etching process applies equally to this embodiment as well.

Figure 4G:
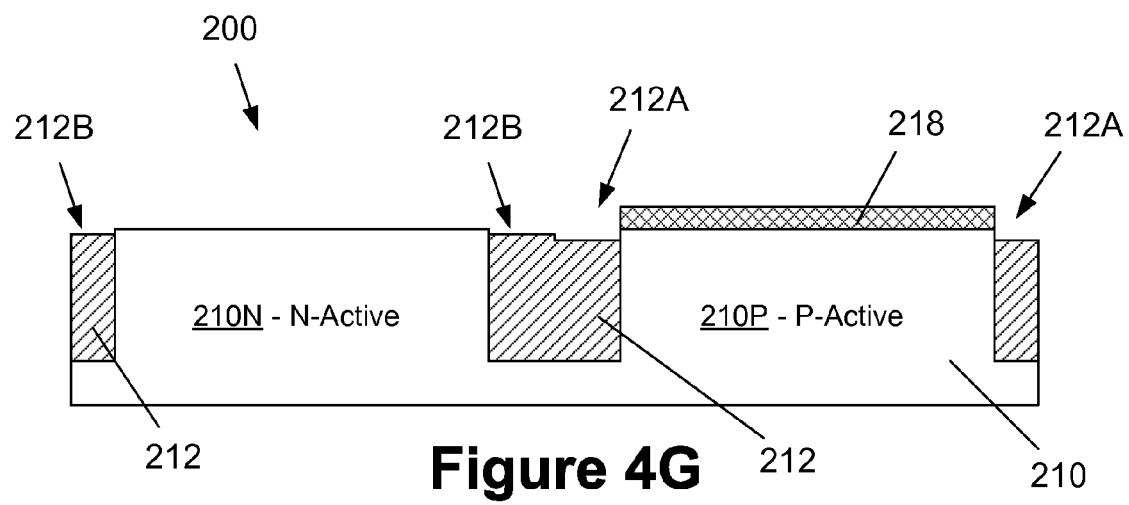

FIG. 4G depicts the device after the second patterned mask layer 220 has been removed, e.g., by performing a plasma-based ashing process. As can be seen, using this illustrative embodiment of the novel techniques disclosed herein, the consumption of the material of the isolation structures 212 may be generally reduced and there may be a reduction in the topography changes of the isolation structures 212 as compared to the prior art process described in the background section of this application. Thus, by forming the device 200 using this illustrative embodiment of the various methods disclosed herein, one or more of the problems outlined in the background section of this application may be reduced or eliminated.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method, comprising:

forming a plurality of isolation structures comprised of silicon dioxide in a semiconducting substrate, said isolation structures defining first and second active regions where first and second transistor devices, respectively, will be formed;

forming a hard mask layer on a surface of said substrate above said first and second active regions and above at least one isolation structures, said hard mask layer comprising at least one of carbon, fluorine, xenon or germanium ions such that the hard mask layer exhibits an etch rate that is greater than said silicon dioxide when exposed to an etch process designed to remove a portion of said silicon dioxide;

performing a first etching process to remove a portion of said hard mask layer and to thereby expose a surface of one of said first and second active regions;

after performing said first etching process, forming a channel semiconductor material on said surface of said active region that was exposed by performing said first etching process; and after forming said channel semiconductor material, performing a second etching process to remove remaining portions of said hard mask layer that were not removed during said first etching process.

2. The method of claim 1, wherein forming said hard mask layer that comprises at least one of carbon, fluorine, xenon or germanium ions comprises:

depositing a layer of hard mask material on said surface of said substrate;

performing a first ion implantation process to introduce said ions into a first portion of said layer of hard mask material; and performing a second ion implantation process to introduce said ions into a second portion of said layer of hard mask material.

3. The method of claim 1, wherein forming said hard mask layer that comprises at least one of carbon, fluorine, xenon or germanium ions comprises:

depositing a layer of hard mask material on said surface of said substrate; and performing a single ion implantation process to introduce said ions into said layer of hard mask material.

4. The method of claim 3, wherein said single ion implantation process is performed at a dopant dose within the range of about $1e^{14}$-$3e^{15}$ ions/cm$^2$ and an energy level within the range of about 10-50 keV.

5. The method of claim 1, wherein forming said hard mask layer that comprises at least one of carbon, fluorine, xenon or germanium ions comprises performing an in situ deposition process to form said hard mask layer on a surface of said substrate above said first and second active regions, wherein carbon, fluorine, xenon or germanium ions are introduced into said hard mask layer during said in situ deposition process.

6. The method of claim 1, wherein said first active region is a P-active region where a PFET transistor will be formed and said second active region is an N-active region where an NFET transistor will be formed.

7. The method of claim 1, wherein said first active region is an N-active region where an NFET transistor will be formed and said second active region is a P-active region where a PFET transistor will be formed.

8. The method of claim 1, wherein forming said layer of channel semiconductor material comprises performing an epitaxial deposition process to form a channel semiconductor material comprised of silicon/germanium, silicon/carbon, a Group III/V material, GaAs or InGaAs.

9. The method of claim 1, wherein said isolation structures are shallow trench isolation structures.

10. The method of claim 1, wherein said hard mask layer and said isolation structures are comprised of silicon dioxide.

11. The method of claim 10, wherein said first active region is a P-active region where a PFET transistor will be formed and said second active region is an N-active region where an NFET transistor will be formed and wherein said layer of channel semiconductor material is comprised of silicon/germanium.

12. The method of claim 1, wherein each of said first and second ion implantation processes is performed at a dopant dose within the range of about $1e^{14}$-$3e^{15}$ ions/cm$^2$ and an energy level within the range of about 10-50 keV.

13. The method of claim 1 wherein:

performing said first etching process comprises removing a portion of said hard mask layer to thereby expose a surface of said first active region, said first etching process consuming a first portion of a surface of said isolation structure to a first depth;

after forming said channel semiconductor material on said surface of said first active region, the method comprises forming a second patterned mask layer over said channel region and over said first portion of said surface of said isolation structure; and after forming said channel semiconductor material and said second patterned mask layer, the method comprises performing a second etching process to remove remaining portions of said hard mask layer that were not removed during said first etching process, said second etching process consuming a second portion of said surface of said isolation structure to a second depth that is substantially the same as said first depth.

14. A method, comprising:

forming a plurality of isolation structures comprised of silicon dioxide in a semiconducting substrate, said isolation structures defining first and second active regions where first and second transistor devices, respectively, will be formed;

forming a hard mask layer comprised of silicon dioxide on a surface of said substrate above said first and second active regions and above at least one of said isolation structures, said hard mask layer comprising a region containing at least one of carbon, fluorine, xenon or germanium ions such that the hard mask layer exhibits an etch rate that is greater than said silicon dioxide when exposed to an etch process designed to remove a portion of said silicon dioxide;

performing a first etching process to remove a portion of said hard mask layer and thereby expose a surface of one of said first and second active regions;

after performing said first etching process, forming a channel semiconductor material on said surface of said active region that was exposed by performing said first etching process; and after forming said channel semiconductor material, performing a second etching process to remove remaining portions of said hard mask layer that were not removed during said first etching process.

15. The method of claim 14, wherein forming said hard mask layer that comprises at least one of carbon, fluorine, xenon or germanium ions comprises:

depositing a layer of hard mask material on said surface of said substrate;

performing a first ion implantation process to introduce said ions into a first portion of said layer of hard mask material; and performing a second ion implantation process to introduce said ions into a second portion of said layer of hard mask material.

16. The method of claim 14, wherein forming said hard mask layer that comprises at least one of carbon, fluorine, xenon or germanium ions comprises:

depositing a layer of hard mask material on said surface of said substrate; and performing a single ion implantation process to introduce said ions into said layer of hard mask material.

17. The method of claim 16, wherein said single ion implantation process is performed at a dopant dose within the range of about $1e^{14}$-$3e^{15}$ ions/cm$^2$ and an energy level within the range of about 10-50 keV.

18. The method of claim 14, wherein forming said hard mask layer that comprises at least one of carbon, fluorine, xenon or germanium ions comprises performing an in situ deposition process to form said hard mask layer on a surface of said substrate above said first and second active regions, wherein carbon, fluorine, xenon or germanium ions are introduced into said hard mask layer during said in situ deposition process.

19. The method of claim 14, wherein said first active region is a P-active region where a PFET transistor will be formed and said second active region is an N-active region where an NFET transistor will be formed.

20. The method of claim 14, wherein said first active region is an N-active region where an NFET transistor will be formed and said second active region is a P-active region where a PFET transistor will be formed.

21. The method of claim 20, wherein forming said layer of channel semiconductor material comprises performing an epitaxial deposition process to form a channel semiconductor material comprised of silicon/germanium, silicon/carbon, a Group III/V material, GaAs or InGaAs.

22. The method of claim 14, wherein each of said first and second ion implantation processes is performed at a dopant dose within the range of about $1e^{14}$-$3e^{15}$ ions/cm$^2$ and an energy level within the range of about 10-50 keV.

23. The method of claim 14 wherein:
performing said first etching process comprises removing a portion of said hard mask layer to thereby expose a surface of said first active region, said first etching process consuming a first portion of a surface of said isolation structure to a first depth;
after forming said channel semiconductor material on said surface of said first active region, the method comprises forming a second patterned mask layer over said channel region and over said first portion of said surface of said isolation structure; and
after forming said channel semiconductor material and said second patterned mask layer, the method comprises performing a second etching process to remove remaining portions of said hard mask layer that were not removed during said first etching process, said second etching process consuming a second portion of said surface of said isolation structure to a second depth that is substantially the same as said first depth.

24. A method, comprising:
forming a plurality of isolation structures comprised of silicon dioxide in a semiconducting substrate, said isolation structures defining first and second active regions where first and second transistor devices, respectively, will be formed;
forming a hard mask layer on a surface of said substrate above said first and second active regions and above at least one of said isolation structures;
performing an ion implantation process to implant carbon, fluorine, xenon or germanium ions into said hard mask layer such that the hard mask layer exhibits an etch rate that is greater than said silicon dioxide when exposed to an etch process designed to remove a portion of said silicon dioxide;
after performing said ion implantation process, forming a first patterned mask layer above said substrate that covers said second active region but not said first active region;
performing a first etching process through said first patterned mask layer to remove a portion of said hard mask layer positioned above said first active region;
removing said first patterned mask layer;
forming a channel semiconductor material on said surface of said first active region;
forming a second patterned mask layer above said substrate that covers said first active region but not said second active region;
performing a second etching process through said second patterned mask layer to remove a portion of said hard mask layer positioned above said second active region; and
removing said second patterned mask layer.

25. The method of claim 24, wherein said first active region is a P-active region where a PFET transistor will be formed and said second active region is an N-active region where an NFET transistor will be formed.

26. The method of claim 24, wherein said first active region is an N-active region where an NFET transistor will be formed and said second active region is a P-active region where a PFET transistor will be formed.

27. The method of claim 24, wherein forming said layer of channel semiconductor material comprises performing an epitaxial deposition process to form a channel semiconductor material comprised of silicon/germanium, silicon/carbon, a Group III/V material, GaAs or InGaAs.

28. The method of claim 24, wherein said hard mask layer and said isolation structures are comprised of silicon dioxide.

29. The method of claim 28, wherein said first active region is a P-active region where a PFET transistor will be formed and said second active region is an N-active region where an NFET transistor will be formed and wherein said layer of channel semiconductor material is comprised of silicon/germanium.

30. The method of claim 24, wherein said ion implantation process is performed at a dopant dose within the range of about $1e^{14}$-$3e^{15}$ ions/cm$^2$ and an energy level within the range of about 10-50 keV.

31. The method of claim 24, wherein said ion implantation process is performed at a dopant dose within the range of about $1e^{14}$-$3e^{15}$ ions/cm$^2$ and an energy level within the range of about 10-50 keV.

32. The method of claim 24 wherein:
performing said first etching process comprises removing a portion of said hard mask layer to thereby expose a surface of said first active region, said first etching process consuming a first portion of a surface of said isolation structure to a first depth;
after forming said channel semiconductor material on said surface of said first active region, the method comprises forming a second patterned mask layer over said channel region and over said first portion of said surface of said isolation structure; and
after forming said channel semiconductor material and said second patterned mask layer, the method comprises performing a second etching process to remove remaining portions of said hard mask layer that were not removed during said first etching process, said second etching process consuming a second portion of said surface of said isolation structure to a second depth that is substantially the same as said first depth.

33. A method, comprising:
forming a plurality of isolation structures in a semiconducting substrate, said isolation structures defining first and second active regions where first and second transistor devices, respectively, will be formed;

forming a hard mask layer on a surface of said substrate above said first and second active regions by depositing a layer of hard mask material on said surface of said substrate and performing a single ion implantation process to introduce into said layer of hard mask material ions of at least one of carbon, fluorine, xenon or germanium ions, wherein said single ion implantation process is performed at a dopant dose within the range of about $1e^{14}$-$3e^{15}$ ions/cm$^2$ and an energy level within the range of about 10-50 keV;

performing a first etching process to remove a portion of said hard mask layer and thereby expose a surface of one of said first and second active regions;

after performing said first etching process, forming a channel semiconductor material on said surface of said active region that was exposed by performing said first etching process; and after forming said channel semiconductor material, performing a second etching process to remove remaining portions of said hard mask layer that were not removed during said first etching process.

34. A method, comprising:

forming a plurality of isolation structures comprised of silicon dioxide in a semiconducting substrate, said isolation structures defining first and second active regions where first and second transistor devices, respectively, will be formed;

depositing a layer of hard mask material on a surface of said substrate;

performing a single ion implantation process to introduce into said layer of hard mask material ions of at least one of carbon, fluorine, xenon or germanium, wherein said single ion implantation process is performed at a dopant dose within the range of about $1e^{14}$-$3e^{15}$ ions/cm$^2$ and an energy level within the range of about 10-50 keV;

performing a first etching process to remove a portion of said hard mask layer and thereby expose a surface of one of said first and second active regions;

after performing said first etching process, forming a channel semiconductor material on said surface of said active region that was exposed by performing said first etching process; and after forming said channel semiconductor material, performing a second etching process to remove remaining portions of said hard mask layer that were not removed during said first etching process.

35. A method, comprising:

forming a plurality of isolation structures in a semiconducting substrate, said isolation structures defining first and second active regions where first and second transistor devices, respectively, will be formed;

forming a hard mask layer on a surface of said substrate above said first and second active regions;

performing an ion implantation process to implant carbon, fluorine, xenon or germanium ions into said hard mask layer, wherein said ion implantation process is performed at a dopant dose within the range of about $1e^{14}$-$3e^{15}$ ions/cm$^2$ and an energy level within the range of about 10-50 keV;

after performing said ion implantation process, forming a first patterned mask layer above said substrate that covers said second active region but not said first active region;

performing a first etching process through said first patterned mask layer to remove a portion of said hard mask layer positioned above said first active region;

removing said first patterned mask layer;

forming a channel semiconductor material on said surface of said first active region;

forming a second patterned mask layer above said substrate that covers said first active region but not said second active region;

performing a second etching process through said second patterned mask layer to remove a portion of said hard mask layer positioned above said second active region; and removing said second patterned mask layer.

\* \* \* \* \*

UNITED STATES PATENT AND TRADEMARK OFFICE
CERTIFICATE OF CORRECTION

PATENT NO. : 8,871,586 B2
APPLICATION NO. : 13/654849
DATED : October 28, 2014
INVENTOR(S) : Scheiper et al.

Page 1 of 1

It is certified that error appears in the above-identified patent and that said Letters Patent is hereby corrected as shown below:

In the claims

Claim 1, column 12, line 62, insert --of said-- before "isolation structures,".

Signed and Sealed this
Twenty-fourth Day of March, 2015

Michelle K. Lee
*Director of the United States Patent and Trademark Office*